United States Patent

Yao et al.

[11] Patent Number: 5,867,242
[45] Date of Patent: Feb. 2, 1999

[54] ELECTRICALLY ISOLATED PIXEL ELEMENT IN A LOW VOLTAGE ACTIVATED ACTIVE MATRIX LIQUID CRYSTAL DISPLAY AND METHOD

[75] Inventors: William W. Yao, Los Altos; Ronald T. Fulks, Mountain View, both of Calif.

[73] Assignee: Xerox Corporation, Stamford, Conn.

[21] Appl. No.: 840,443

[22] Filed: Apr. 1, 1997

Related U.S. Application Data

[63] Continuation of Ser. No. 235,009, Apr. 28, 1994, abandoned.

[51] Int. Cl.$^6$ ............................ G02F 1/136; G02F 1/1333
[52] U.S. Cl. ............................. 349/122; 349/43; 349/138
[58] Field of Search ................................. 359/59, 58, 57; 349/42, 43, 138, 132; 257/59

[56] References Cited

U.S. PATENT DOCUMENTS

| | | | |
|---|---|---|---|
| 5,182,620 | 1/1993 | Shimada et al. | 257/72 |
| 5,182,661 | 1/1993 | Ikeda et al. | 359/59 |
| 5,185,601 | 2/1993 | Takeda et al. | 359/59 |
| 5,208,690 | 5/1993 | Hayashi et al. | 359/59 |
| 5,486,939 | 1/1996 | Fulks | 349/122 |
| 5,518,805 | 5/1996 | Ho et al. | 428/213 |
| 5,619,033 | 4/1997 | Weisfield | 257/444 |

FOREIGN PATENT DOCUMENTS

| | | | |
|---|---|---|---|
| 372821 | 6/1990 | European Pat. Off. . | |
| 0450941 | 10/1991 | European Pat. Off. | 359/59 |
| 449123 | 10/1991 | European Pat. Off. . | |
| 4-50924 | 2/1992 | Japan . | |
| 4106532 | 4/1992 | Japan . | |
| 4265945 | 9/1992 | Japan | 359/59 |
| 4253342 | 1/1993 | Japan . | |

OTHER PUBLICATIONS

Kaneko, E. Liquid Crystal TV Displays: Principles and Applications of Liquid Crystal Displays. KTK Scientific Publishers/Tokyo, ©1987, pp. 211–277.

European Search Report date Aug. 21, 1995 for Application No. 95302792.7.

*Primary Examiner*—William L. Sikes
*Assistant Examiner*—Toan Ton
*Attorney, Agent, or Firm*—Stuart P. Kaler; Tracy L. Hurt

[57] ABSTRACT

The present invention is a novel pixel structure, and method for making the same, that reduces wasteful voltage drop associated with other pixel structures that cover their pixel elements with a final passivation layer. The presently claimed pixel structure is a combination of a thin film transistor (TFT), an associated pixel element, and a passivation layer. The TFT is first deposited atop a suitable substrate and patterned. Then, the passivation layer is deposited on top of the thin film transistor. Contact cuts are made into the passivation layer where the pixel element is to contact the TFT. Finally, the pixel element is deposited—lying atop the passivation layer and contacting with the underlying TFT where the contact cuts were made in the passivation layer.

2 Claims, 4 Drawing Sheets

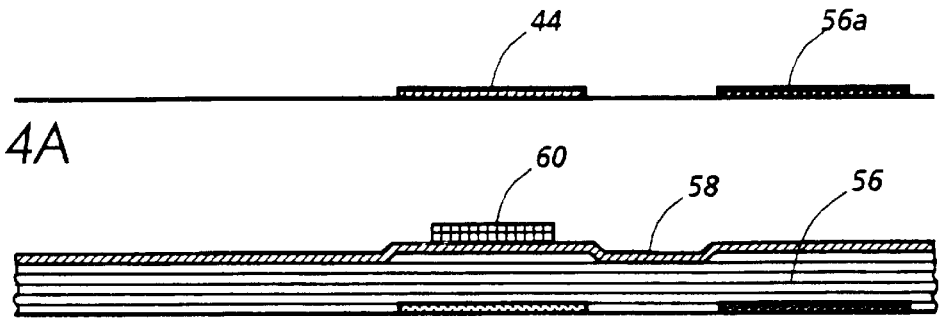
Fig. 4A
Fig. 4B
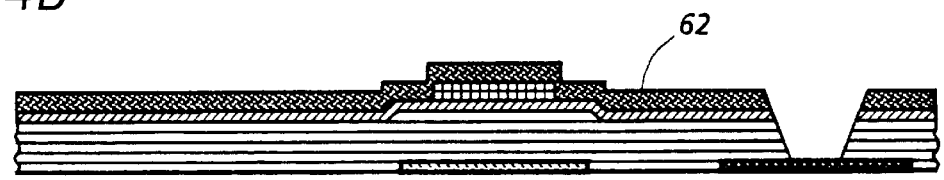
Fig. 4C
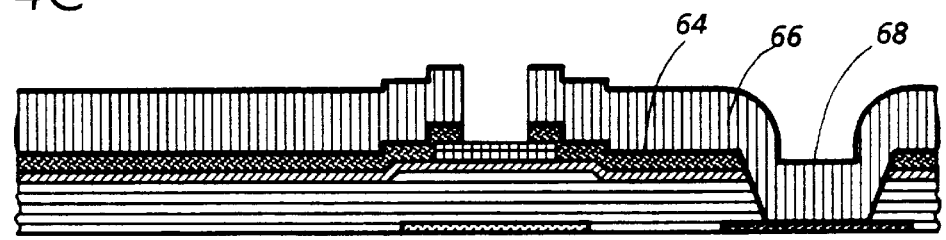
Fig. 4D
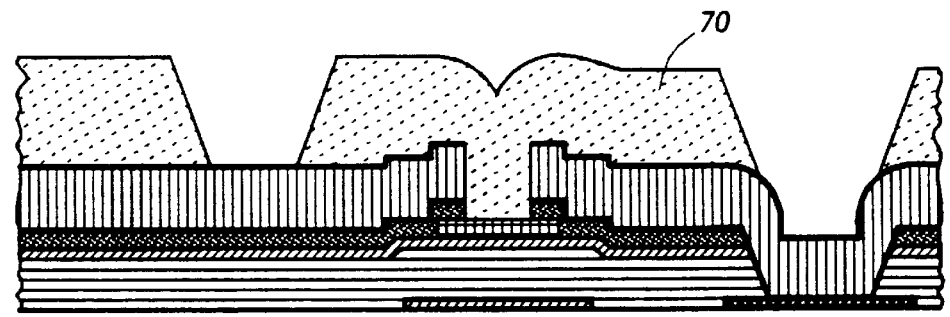
Fig. 4E
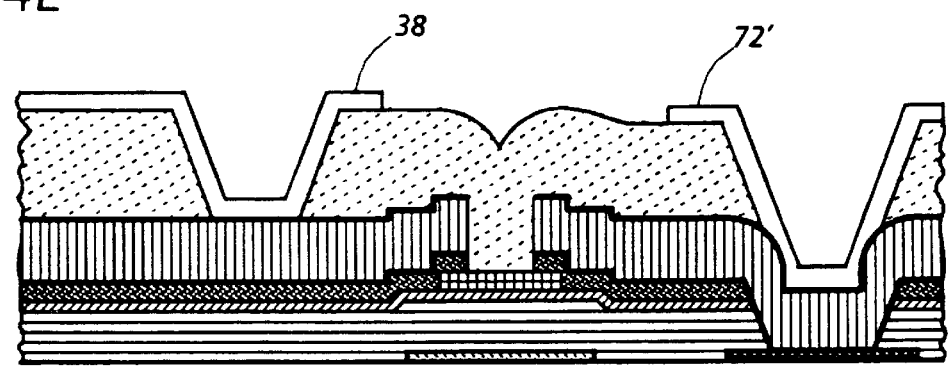
Fig. 4F 5,867,242

ELECTRICALLY ISOLATED PIXEL ELEMENT IN A LOW VOLTAGE ACTIVATED ACTIVE MATRIX LIQUID CRYSTAL DISPLAY AND METHOD

This application is a continuation of application Ser. No. 08/235,009, filed Apr. 28, 1994, now abandoned.

FIELD OF THE INVENTION

The present invention relates in general to a pixel structure for an active matrix liquid crystal display (AMLCD) and, in particular, to a pixel structure for a low voltage activated AMLCD and a method for making same.

BACKGROUND OF THE INVENTION

Liquid crystal displays (LCDs) are increasingly replacing cathode ray tubes as displays in computers and in other video screen applications. This is particularly true for devices where minimizing size and weight are important design considerations. For example, LCDs are used almost exclusively in portable computers and laptops. Two types of standard architectures have emerged for LCDs: passive and active matrix. Passive LCDs use a pair of electrode plates with a liquid crystal layer sandwiched between them. Each plate in a passive LCD has a set of lines that runs orthogonal to the lines in the opposing plate. Addressing individual pixels in a passive LCD amount to placing a signal of the pair of lines whose intersection defines the pixel location. AMLCDs, while a little more expensive than passive LCDs, are preferred for high performance applications because of their better viewing angle, and higher contrast and resolution than passive LCDs. Today, several trends are currently speeding the acceptance of both types of liquid crystal displays (i.e. active matrix and passive) in the marketplace—decreasing cost of manufacture, increasing pixel densities and resolution, increasingly faster screen refresh rates—to name a few.

The portable consumer electronic goods that are employing AMLCDs are typically battery powered. One appealing aspect to the consumer is the "mean time between battery recharge" for an item—the longer a good can operate on a fully charged set of batteries, the more desirable. Thus, it is desirable for component suppliers to such portable goods to have energy efficient components. The same is true for manufacturers of AMLCDs.

Typically, an AMLCD comprises a liquid crystal layer sandwiched between an active matrix and a common electrode plate. The active matrix itself comprises a collection of pixel structures. Each such pixel structure comprises a thin film transistor (TFT) and a pixel element, connected in such a fashion that the source and drain lines of the TFT are coupled to a data line and the pixel element respectively. A passivation layer is usually deposited over and covering both the TFT and the pixel element, usually consisting of indium-tin-oxide (ITO). One such AMLCD structure currently being used is a 6.3 million pixel, 13 inch diagonal display built by the Xerox Corporation. The structure of that particular AMLCD is described in commonly assigned U.S. Patent Application, application Ser. No. 08/235,011 (Attorney Docket Number D/94179), entitled "Thin-Film Structure with Dense Array of Binary Control Units for Presenting Images" (hereinafter the "Array" application), filed concurrently herewith and which is hereby incorporated by reference.

One way to reduce the amount of energy consumption of an AMLCD is by reducing the amount of voltage required to activate the liquid crystal layer. To activate the liquid crystal, a threshold voltage must be applied between the pixel element and the common electrode plate. Therefore, any change in design that allows the pixel element and the common electrode plate to reach the threshold voltage with a lesser amount of charge would save on energy consumption. One way to achieve threshold voltage with lesser amounts of charge is to ensure that no unnecessary voltage drop is occurring between the pixel element and the common electrode plate.

Therefore, it is desirable to design a AMLCD pixel structure that would avoid unnecessary voltage drops between the pixel element and the common electrode plate.

Thus, it is an object of the present invention to design a AMLCD pixel structure that decreases the amount of wasteful voltage drop that could otherwise be used to reach the threshold voltage needed to activate the liquid crystal.

SUMMARY OF THE INVENTION

In summary, the present invention is a novel pixel structure, and method for making the same, that reduces the wasteful voltage drop associated with typical pixel structures. The presently claimed pixel structure is a combination of a thin film transistor (TFT), an associated pixel element, and a passivation layer. The TFT is first deposited atop a suitable substrate and patterned. Then, the passivation layer is deposited on top of the thin film transistor. Contact cuts are made through the passivation layer where the pixel element is to contact the TFT. Finally, the pixel element is deposited atop the passivation layer.

One advantage of the present invention is a reduction in wasteful voltage drops. In typical pixel structures, the passivation layer is deposited on top of the pixel element. The intervening dielectric of the passivation layer creates an undesirable voltage drop across the liquid crystal gap. The placement of the pixel element as the top layer of the pixel structure eliminates this drop and makes the entire structure more energy efficient.

Another advantage of the present invention is a more complete electrical isolation of the pixel element. In some pixel structure designs, the close spacing of the pixel element and metal lines causes some shorting and current leakage. The present invention, however, improves the electrical isolation of the pixel element by placing distance between the pixel element and metal lines in the vertical direction and by placing the passivation layer (itself a dielectric) between the pixel element and the metal lines.

Additional objects and features of the present invention will be more readily apparent from the following detailed description of an exemplary embodiment thereof, as illustrated in the accompanying drawings.

BRIEF DESCRIPTION OF THE DRAWINGS

The purpose and advantages of the present invention will be apparent to those skilled in the art from the following detailed description in conjunction with the drawings.

FIGS. 4A–4F depict the fabrication process of the presently claimed pixel structure and the resulting structures after each step.

DETAILED DESCRIPTION OF THE PREFERRED EMBODIMENTS

The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications without departing from the spirit and scope of the present invention as defined by the appended claims. Thus, the present invention is not intended to be limited to the embodiment shown, but is to be accorded the widest scope consistent with the principles and features disclosed herein.

Figure 1:
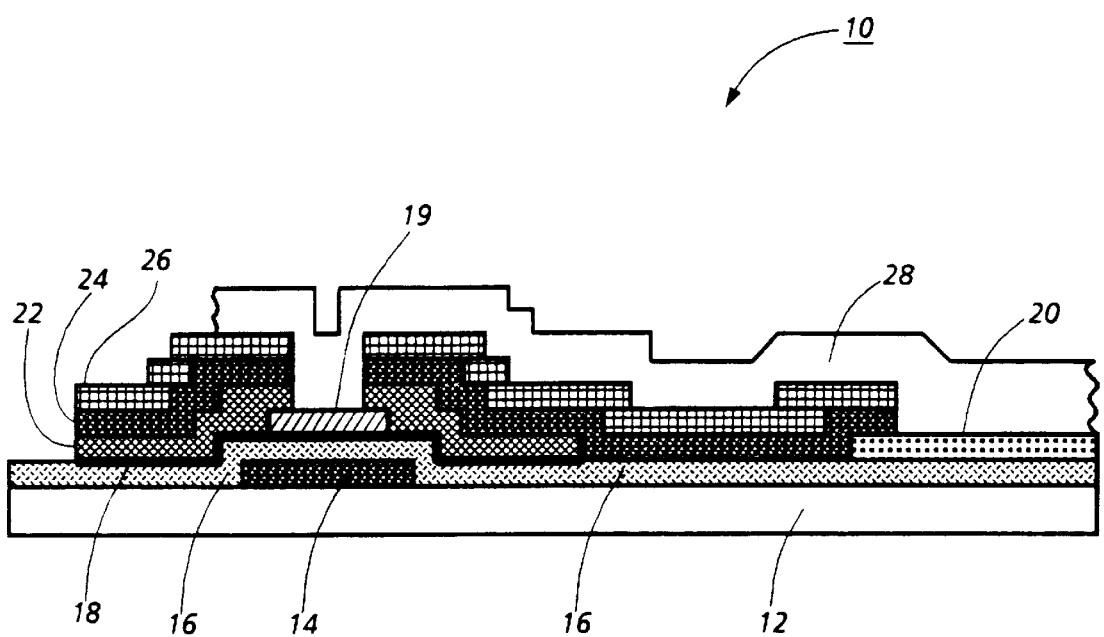
FIG. 1 depicts the pixel structure of an AMLCD which is being used in the current 6.3 million pixel, 13 inch diagonal display built by the Xerox Corporation, as described in the above-incorporated Array application.

Referring now to FIG. 1, a pixel structure 10 of an AMLCD is displayed which is currently in use in the 6.3 million pixel, 13 inch diagonal display built by the Xerox Corporation. The structure comprises glass substrate 12, gate metal 14, a bottom nitride layer (typically SiN) 16, an active, intrinsic amorphous silicon layer 18, a top nitride layer (typically SiN) 19, an ITO pixel element 20, N+ amorphous silicon layer 22, barrier metal layer 24, data metal layer 26, and passivation layer 28. A more detailed description of the composition, method of construction, and operation of this particular structure is found in the above-mentioned Array application, herein incorporated by reference.

The important feature concerning FIG. 1 is the placement of the ITO pixel 20 in relation to the passivation layer 28. The passivation layer lies atop the pixel element, creating an undesirable voltage drop that could have effectively been used to reach the threshold voltage in the liquid crystal.

Figure 2:
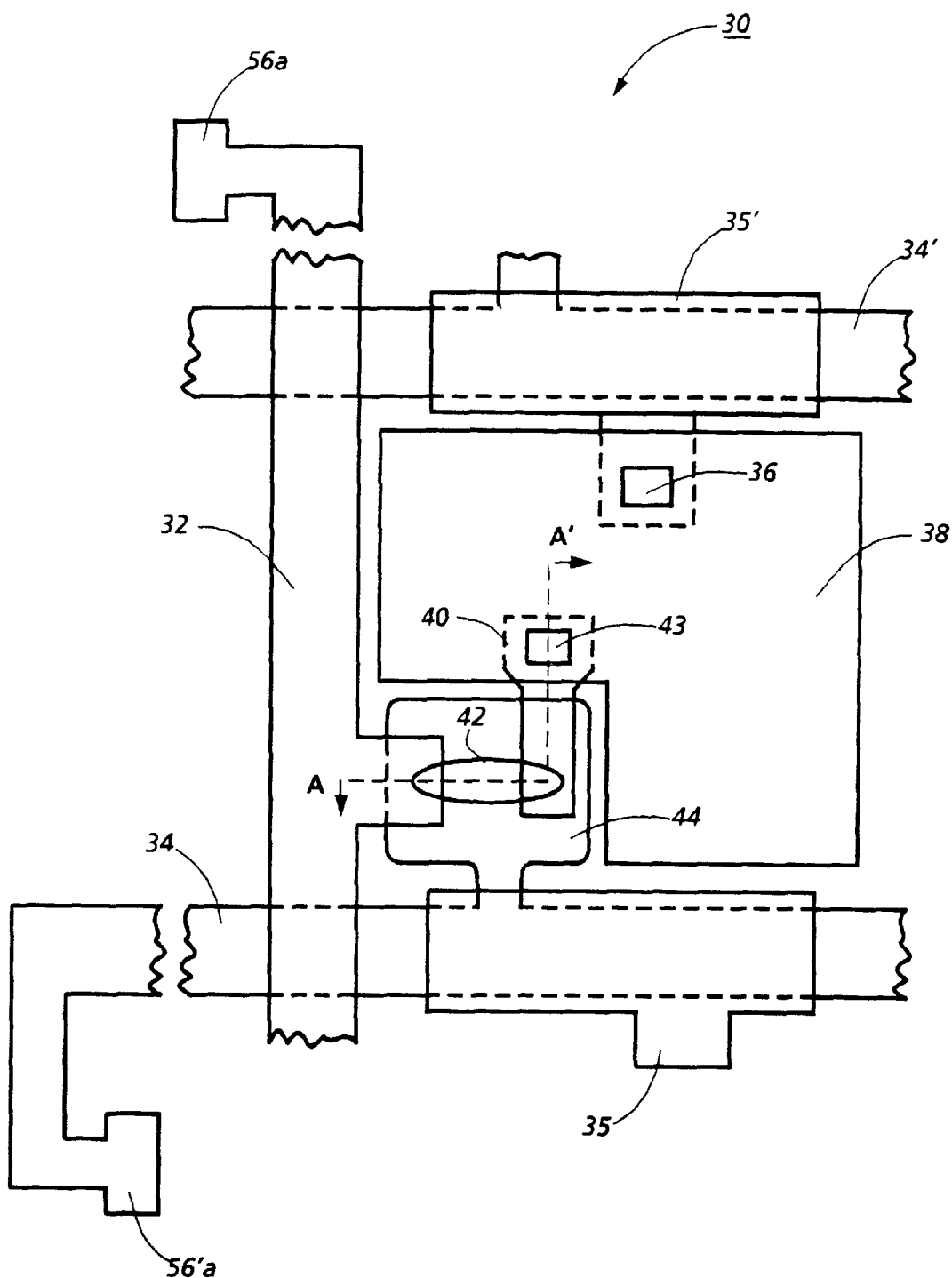
FIG. 2 is a partially transparent, schematic view of the pixel structure made in accordance with the principles of the present invention.

The present invention avoids this undesired voltage drop by placing the pixel element atop the passivation layer—closer to the liquid crystal material. FIG. 2 is a partially transparent, schematic view of a pixel structure 30 made in accordance with the principles of the present invention. The borders of the pixel surface 30 are broadly defined by data line 32 and gate line 34. These lines provide the pathway for the electrical signals that either route image data (in the form of a charge) into the pixel element 38 or enable that flow of data respectively. Both the gate lines and the data lines extend across the entire length and breadth of the array which comprises these pixel structures and connect to outside electronics (not shown) via metal "pads" 56a and 56a'.

The thin film transistor (TFT) of the present invention comprises the structure that runs along line A–A'. The gate line 34 can be seen as expanding into the region defined by electrode 44. This gate electrode 44 is the bottom layer that underlies all other layers in the TFT. Deposited atop the gate electrode is an extension of data line 32 (comprising the source line of the TFT), a top metal layer 40 that electrically couples the pixel element 38 to the rest of the TFT (comprising the drain line of the TFT). An island channel 42 electrically couples top metal layer 40 to data line 32. A passivation layer (not shown) is deposited atop the TFT. Cuts 43 and 36 through the passivation layer are provided to allow electrical contact to the pixel element 38 and the TFT. Finally, the pixel element 38 is deposited and patterned atop the passivation layer.

In operation, a charge placed on the gate pad 44 enables a conducting channel to form between top metal layer 40 and data line 32 (through the active amorphous silicon layer, as described further in conjunction with FIG. 3 below). This allows the image data (as represented by the charge present on the data line) to be read into the pixel element 38. When the charge is removed from the gate, the flow of charge between the pixel element and data line is disabled. Capacitors, such as 35 and 35', insure that any charge in the pixel element lost to dissipation is replenished over time. A more detailed description of the operation and architecture of the pixel structure 30 may be found in the above incorporated Array application.

Figure 3:
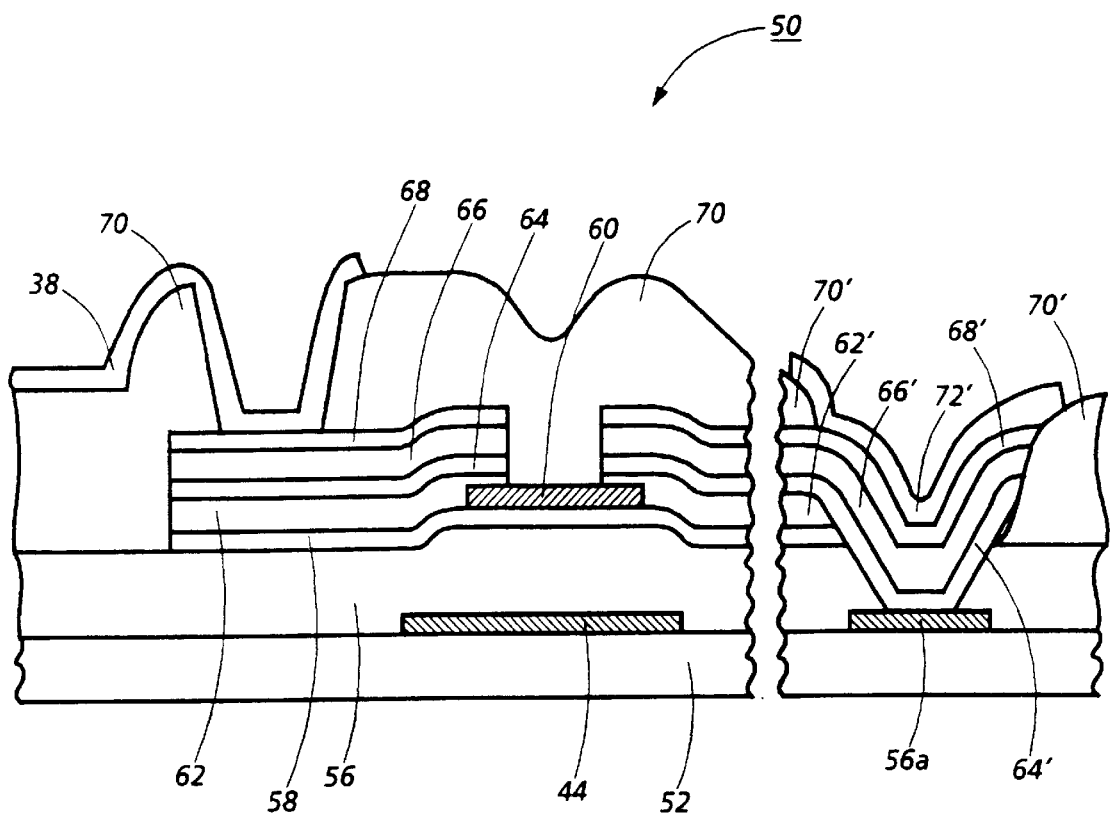
FIG. 3 is a cross sectional view of the pixel structure as taken in the direction of line A–A' shown in FIG. 2.

FIG. 3 is a cross sectional view of the pixel structure 50 as taken along curve A–A' shown in FIG. 2. It will be appreciated that FIG. 3 is neither drawn to scale for the various dimensions of its layers nor is it continuous in length. The break in the length of the cross section 15 where the semiconductor layers are deemed to extend out to pad 56a.

Substrate 52 is made of a suitable material for AMLCD applications, usually glass. Gate metal 44 and pad metal 56a are deposited and patterned atop substrate 52. Bottom nitride 56 (typically SiN), active amorphous silicon layer 58, and top nitride 60 (typically SiN) are deposited and the top nitride layer 60 is patterned. N+ doped silicon 62 is then deposited. Lastly, titanium-tungsten (TiW) alloy layer 64, aluminum layer 66, and another TiW layer 68 form the top metal layer of pixel structure 50. The metal and N+ layers are then masked and etched. A passivation layer 70 is deposited and patterned such that the final ITO pixel layer 38 may electrically contact the TFT top metal layer 68 and pad metal 56a. The layers 58, 62, 64, 66, and 68 connecting pixel element 38 to the TFT broadly defines the source line of the TFT. The corresponding layers connecting pad covering 72' to the TFT broadly defines the drain line of the TFT.

To switch the TFT on, a charge is placed on gate 44. The charge induces a conductive channel through which current flows through active amorphous silicon 60 when a potential difference exists between the source (comprising layers 62', 64', 66', and 68') and drain (comprising layers 62, 64, 66, and 68) lines. The actual physical operation and properties of the conducting channel are well known to those skilled in the art.

One of the advantages of the pixel structure depicted in FIG. 3 is the reduction in wasted voltage drop. The presently claimed pixel structure positions its pixel element 38 atop its passivation layer 70—as opposed to burying the pixel element beneath the passivation layer. As discussed above, this placement removes the wasteful voltage drop across the passivation dielectric that would normally occur if the passivation layer was interposed between the pixel element and the liquid crystal layer of the AMLCD.

The other advantage seen from FIG. 3 is the improved electrical isolation of the pixel element 38 from the metal lines 68, 66, 64 and 62—except where contact is deliberately made by making cuts in the passivation layer 70. The electrical isolation is improved two ways. First, the top-layered pixel element has an increased distance from these lines in the vertical direction. Second, the present invention places the passivation layer (itself a dielectric) between the pixel element and the metal lines.

FIGS. 4A–4F depict the fabrication process of the presently claimed pixel structure and the resulting structures after each step. FIG. 4A shows the result of the first masking step. Gate and pad metal layers 44 and 56a, respectively, are deposited to a thickness of about 1500 Å. The metal layer may comprise either sputter deposited MoCr, or a multilayered structure of alternating layers of Al and TiW, or Al with a dual dielectric capping layer, comprising low temperature deposited SiON with high temperature plasma enhanced chemical vapor deposited (PECVD) SiN. These are discussed in greater detail in the following commonly assigned U.S. Patent applications: (Attorney Docket Number D/94237) entitled "Thin-Film Structure with Conductive Molybdenum-Chromium Line; (Attorney Docket Number D/94285) entitled "Hillock-Free Multilayer Metal Lines for High Performance Thin Film Structures; and (Attorney Docket Number D/94286) entitled "Dual Dielectric Capping Layers for Hillock Suppression in Metal Layers in Thin Film Structures", all of which are filed concurrently herewith and are incorporated by reference. These methods of constructing gate and pad metal lines have the advantage of producing low resistance in the gate lines. A separate mask/etch step is then performed to define the dimensions of both the gate and the pad.

FIG. 4B shows bottom nitride layer 56 (typically SiN), an intrinsic silicon layer 58, and a top nitride layer 60 deposited by PECVD method. The bottom nitride layer is deposited at about 300–380 degrees C. for a thickness of about 3000 Å. The intrinsic silicon layer (comprising 5–12% hydrogen) is deposited at about 230–300 degrees C. at a thickness of about 300–500 Å. The top nitride is deposited primarily as an etch stop at 200–250 degrees C. at a thickness of about 1000–1500 Å. The top nitride is then photomasked and etched—resulting in the "island" structure 60.

In FIG. 4C, N+ silicon 62 (comprising 0.5–2% phosphorous and 5–15% hydrogen) is deposited at 200–250 degrees C. for a thickness of about 1000 Å. A mask/etch step occurs that exposes the pad 56a through layers 56, 58, and 62.

In FIG. 4D, a thin (approximately 500 Å) layer of TiW 64 is sputter deposited, followed by a thicker (3000–4000 Å) layer of Al metal 66, and capped by a final (approximately 500–1000 Å) layer of TiW 68. These three metal layers are sputter deposited in sequence in a chamber without breaking the vacuum between depositions. A masking step is made and an etch step is made in three steps: $H_2O_2$ for TiW etch, followed by a standard Al etch, and finally another $H_2O_2$ etch for the bottom TiW layer. A last N+ Si etch comprising of 10:1 $CF_4/O_2$ creates the final TFT structure.

A passivation layer 70 is then deposited, as shown in FIG. 4E. The passivation material used in one embodiment is SiON at a thickness of 6000 Å. The passivation layer is then masked and etched to provide contact with both the TFT and the pad 56a. Lastly, ITO is reactive sputter deposited in 0.5–1.5% $O_2$ to a thickness of about 500–1000 Å. The ITO is masked and patterned to form the pixel element 38 and the pad protective cover 72'. The pixel element is finally annealed at a temperature of 200–230 degrees C. for approximately one hour.

It will be appreciated that the materials or process methods chosen for any of the above layers is incidental to the presently claimed invention. One of the novel aspects of the present invention is the placement of the pixel element as the top layer on the active matrix structure. Thus, the present invention should not be limited to the above detailed steps of fabrication.

In summary, the present invention is a novel pixel structure for an AMLCD device that deposits and patterns the pixel element as the top layer of the AMLCD pixel structure. This design reduces the unnecessary and undesirable voltage drop which occurs if the pixel element is placed underneath any layer, including the passivation layer of the pixel structure.

What is claimed:

1. A pixel structure for an active matrix liquid crystal display, said structure comprising:

a substrate;

a thin film transistor including a gate deposited on said substrate, a nitride layer on said gate, and a layer of amorphous silicon on the nitride layer, a first layer of titanium-tungsten above a portion of the layer of amorphous silicon, a layer of aluminum on the first layer of titanium-tungsten, and a second layer of titanium-tungsten on the layer of aluminum;

a passivation layer deposited on said thin film transistor, the passivation layer having a cut above the second layer of titanium-tungsten; and a pixel of electrode of indium-tin-oxide deposited on said passivation layer.

2. A method of making a pixel structure for an active matrix liquid crystal display having a substrate, the steps of said method comprising:

A) forming a thin film transistor on said substrate, said thin film transistor including a gate deposited on said substrate, a nitride layer on said gate, and including a layer of amorphous silicon on the nitride layer, the thin film transistor including a drain above a portion of the layer of amorphous silicon, the thin film transistor including a first layer and a second layer of titanium tungsten and a layer of aluminum, the first layer of titanium-tungsten being on the drain, the layer of aluminum being on the first layer of titanium-tungsten, and the second layer of titanium-tungsten being on the layer of aluminum;

B) depositing a passivation layer on said thin film transistor, the passivation layer having a cut exposing a portion of the second layer of titanium-tungsten; and C) depositing a pixel electrode on said passivation layer, the pixel electrode comprising indium-tin-oxide and contacting the second layer of titanium-tungsten through the cut in the passivation layer.

* * * * *